United States Patent
Chinthu et al.

(10) Patent No.: US 12,340,841 B2
(45) Date of Patent: Jun. 24, 2025

(54) MULTI-RAIL SENSE CIRCUIT WITH PRE-CHARGE TRANSISTORS AND MEMORY CIRCUIT INCORPORATING THE SENSE CIRCUIT

(71) Applicant: GlobalFoundries U.S. Inc., Malta, NY (US)

(72) Inventors: Siva Kumar Chinthu, Bangalore (IN); Suresh Pasupula, Bangalore (IN); Devesh Dwivedi, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 159 days.

(21) Appl. No.: 18/170,925

(22) Filed: Feb. 17, 2023

(65) Prior Publication Data
US 2024/0282373 A1    Aug. 22, 2024

(51) Int. Cl.
*G11C 13/00*    (2006.01)
*G11C 11/16*    (2006.01)

(52) U.S. Cl.
CPC ........ *G11C 13/004* (2013.01); *G11C 11/1673* (2013.01); *G11C 2013/0054* (2013.01)

(58) Field of Classification Search
CPC .............. G11C 13/004; G11C 11/1673; G11C 2013/0054; G11C 7/065
See application file for complete search history.

(56) References Cited

U.S. PATENT DOCUMENTS

| | | | |
|---|---|---|---|
| 6,191,445 B1 * | 2/2001 | Fujiwara | G11C 16/26 257/321 |
| 2011/0292709 A1 * | 12/2011 | Takayama | G11C 11/4091 365/72 |
| 2012/0294064 A1 * | 11/2012 | Kitagawa | G11C 13/0061 365/148 |
| 2013/0301330 A1 * | 11/2013 | Matsumoto | G11C 11/4094 365/72 |

(Continued)

OTHER PUBLICATIONS

European Search Report and Written Opinion for corresponding EP Application No. 23191931.7-1211 dated Apr. 2, 2024, 10 pages.

(Continued)

*Primary Examiner* — Jay W. Radke
(74) *Attorney, Agent, or Firm* — David Cain; Hoffman Warnick LLC

(57) ABSTRACT

Disclosed are a sense circuit and memory structure incorporating the sense circuit. The sense circuit is connected to voltage rails at VDD1 and VDD2, respectively, where VDD2~½*VDD1. During a sensing operation, VDD1 provides power to develop a voltage differential between Vdata and Vref on sense nodes. A voltage comparator samples Vdata and Vref and, based on a detectable voltage differential (minVdiff), outputs a data output value. To increase the speed at which minVdiff is reached, an equalization process is performed at the initiation of the sensing operation and includes using pre-charge transistors to quickly equalize the sense nodes to VDD2. Following equalization, Vdata and Vref only need to be pulled up or down from VDD2. Thus, minVdiff is reached faster and sampling by the voltage (Continued)

comparator can be performed earlier in time, reducing the overall time required for performing the sensing operation and for powering the sense circuit.

16 Claims, 8 Drawing Sheets

(56) References Cited

U.S. PATENT DOCUMENTS

| | | | |
|---|---|---|---|
| 2016/0188250 A1* | 6/2016 | Wheeler | G11C 7/1006 |
| | | | 711/154 |
| 2018/0039484 A1 | 2/2018 | La Fratta et al. | |
| 2019/0108862 A1 | 4/2019 | Manning | |
| 2019/0227732 A1* | 7/2019 | Jung | G11C 11/1675 |
| 2020/0126610 A1* | 4/2020 | Luo | G06F 12/0638 |

OTHER PUBLICATIONS

Papaix et al., "A New Single Ended Sense Amplifier for Low Voltage Embedded EEPROM Non Volatile Memories," Proceedings of the 2002 IEEE International Workshop on Memory Technology, Design and Testing (MTDT 2002), 5 pages.

Zhang et al., "Sensing Circuit Design Techniques for RRAM in Advanced CMOS Technology Nodes," Micromachines Dec. 2021, 913, 24 pages.

U.S. Appl. No. 18/046,961, filed Oct. 17, 2022, Siva Kumar Chinthu et al., GlobalFoundries U.S. Inc.

* cited by examiner

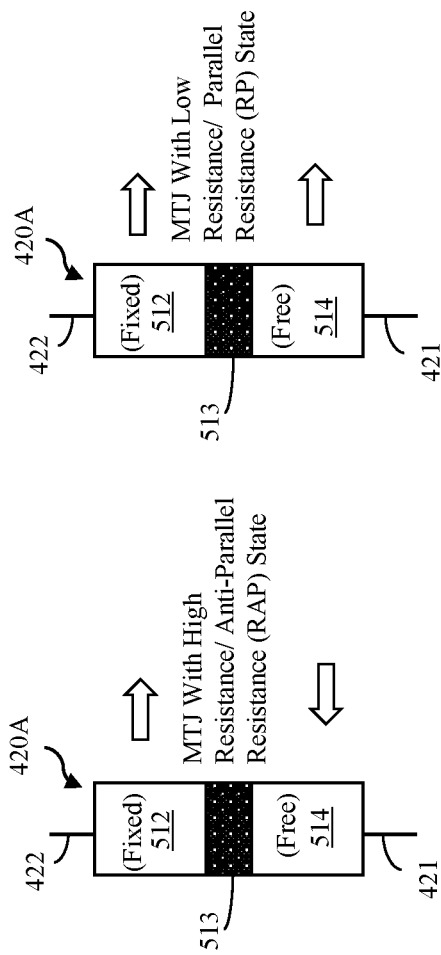
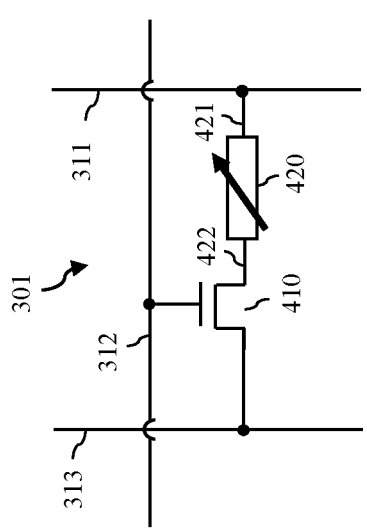
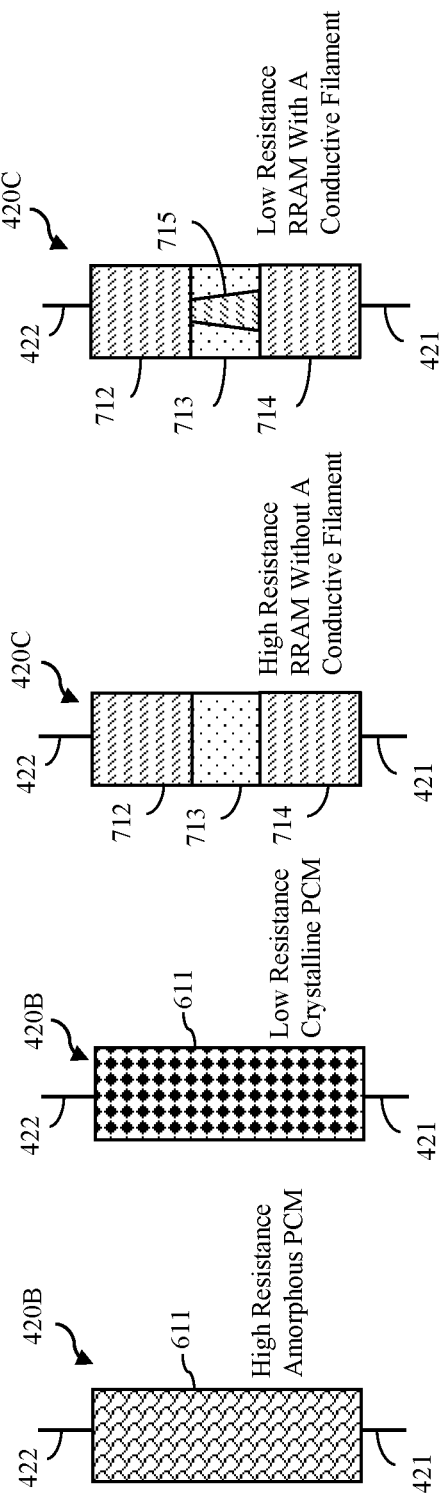

US 12,340,841 B2

MULTI-RAIL SENSE CIRCUIT WITH PRE-CHARGE TRANSISTORS AND MEMORY CIRCUIT INCORPORATING THE SENSE CIRCUIT

BACKGROUND

The present disclosure relates to sense circuits and, particularly, to embodiments of high-speed sense circuits for memory circuits.

Common factors considered in modern integrated circuit (IC) design include, but are not limited to, performance, power scaling, and size scaling. However, oftentimes improvement with respect to one of these factors can result in an undesirable trade-off with respect to one or more of the other factors. For example, in memory structures, such as non-volatile memory (NVM) structures, modifications to improve performance (e.g., increase sensing speed) may result in significant increases in power and/or area consumption.

SUMMARY

Disclosed herein are embodiments of a structure. The structure can include a first voltage rail at a first voltage level and a second voltage rail at a second voltage level different from the first voltage level. The structure can also include a sense circuit. The sense circuit can include sense nodes, cross-coupled transistors electrically connected to the sense nodes, respectively, and to the first voltage rail, and pre-charge transistors electrically connected to the sense nodes, respectively, and to the second voltage rail.

Some embodiments of the structure can include an array of memory cells in columns and rows. The structure can include bitlines for the columns, respectively, with each memory cell in a column being electrically connected to the bitline for that column. The structure can further include a multiplexor electrically connected to at least some of the bitlines. The structure can further include a first voltage rail at a first voltage level and a second voltage rail at a second voltage level different from the first voltage level. The structure can further include a sense circuit, which is connectable by the multiplexor to one of the bitlines. This sense circuit can include sense nodes, cross-coupled transistors electrically connected to the sense nodes, respectively, and to the first voltage rail, and pre-charge transistors electrically connected to the sense nodes, respectively, and to the second voltage rail.

Some embodiments of the structure can include an array of memory cells in columns and rows. The structure can further include bitlines for the columns, respectively, with each memory cell in a column being electrically connected to the bitline for that column. The structure can further include a multiplexor electrically connected to at least some of the bitlines. The structure can further include a first voltage rail at a first voltage level and a second voltage rail at a second voltage level different from the first voltage level. The structure can further include a sense circuit, which is connectable by the multiplexor to one of the bitlines. This sense circuit can include sense nodes, cross-coupled transistors electrically connected to the sense nodes, respectively, and to the first voltage rail, pre-charge transistors electrically connected to the sense nodes, respectively, and to the second voltage rail, and sense enable transistors electrically connected to the sense nodes, respectively, and to ground. The sense circuit can also include a voltage comparator having voltage inputs connected to the sense nodes, respectively. The structure can further include a controller, which is in communication with the sense circuit, and which generates and outputs multiple control signals to the sense circuit to cause the sense circuit to perform a sensing operation.

BRIEF DESCRIPTION OF THE DRAWINGS

The present disclosure will be better understood from the following detailed description with reference to the drawings, which are not necessarily drawn to scale and in which:

FIG. 4 is a schematic diagram illustrative of a resistive NVM cell that could be incorporated into the memory structure of FIG. 3;

FIGS. 5A-5B illustrate a magnetic tunnel junction-type programmable resistor that could be incorporated into the NVM cell of FIG. 4;

FIGS. 6A-6B illustrate a phase change memory-type programmable resistor that could be incorporated into the NVM cell of FIG. 4;

FIGS. 7A-7B illustrate a resistive random access memory-type programmable resistor that could be incorporated into the NVM cell of FIG. 4;

DETAILED DESCRIPTION

As mentioned above, in memory circuits conventional techniques for improving the performance of a sense circuit during a read operation may result in significant increases in power and/or area consumption.

In view of the foregoing, disclosed herein are embodiments of a multi-rail sense circuit structure. The multi-rail sense circuit structure is configured for improved performance (i.e., increased sensing speed) and reduced power consumption during a sensing operation (i.e., a read operation) without significantly increasing area consumption. The reduced sensing speed and reduced power consumption are achieved through a voltage equalization process using a combination of pre-charge transistors and positive voltage rails set at different voltage levels. Specifically, the sense circuit can be connected to multiple voltage rails such that it is referred to as a multi-rail sense circuit. The voltage rails can include a first voltage rail at a first voltage level (VDD1) and a second voltage rail at a second voltage level (VDD2), which is, for example, set between VDD1 and ground. During a sensing operation, VDD1 can power the sense circuit to generate a voltage differential (Vdiff) between voltage parameters (e.g., a data voltage (Vdata) and a reference voltage (Vref)) on a pair of sense nodes. A voltage comparator can sample Vdata and Vref and, based on a detectable voltage differential (minVdiff) (e.g., 110 mV-140 mV, e.g., ~115 mV) can either maintain a data output value (Dout) or switch Dout. To increase the speed at which minVdiff between Vdata and Vref develops on the sense nodes during the sensing operation, an equalization process can be performed upon the initiation of the sensing operation. In this equalization process, pre-charge transistors can be pulsed on and off to quickly equalize Vdata and Vref on the sense nodes to VDD2. After equalization, Vdata and Vref only need to be pulled up or down a relatively small number of millivolts from VDD2 to achieve the minVdiff. As a result, sampling of Vdata and Vref by the voltage comparator can be performed earlier after the initiation of the sensing operation (e.g., less than 5 ns or even less than 4 ns, such as at 3.6 ns, as opposed to 14 ns or more). Thus, the overall time required for performing the sensing operation and for powering the sense circuit is reduced (i.e., sensing speed is increased and power consumption is reduced). Also disclosed herein are embodiments of a memory structure incorporating such a multi-rail sense circuit.

Figure 1:
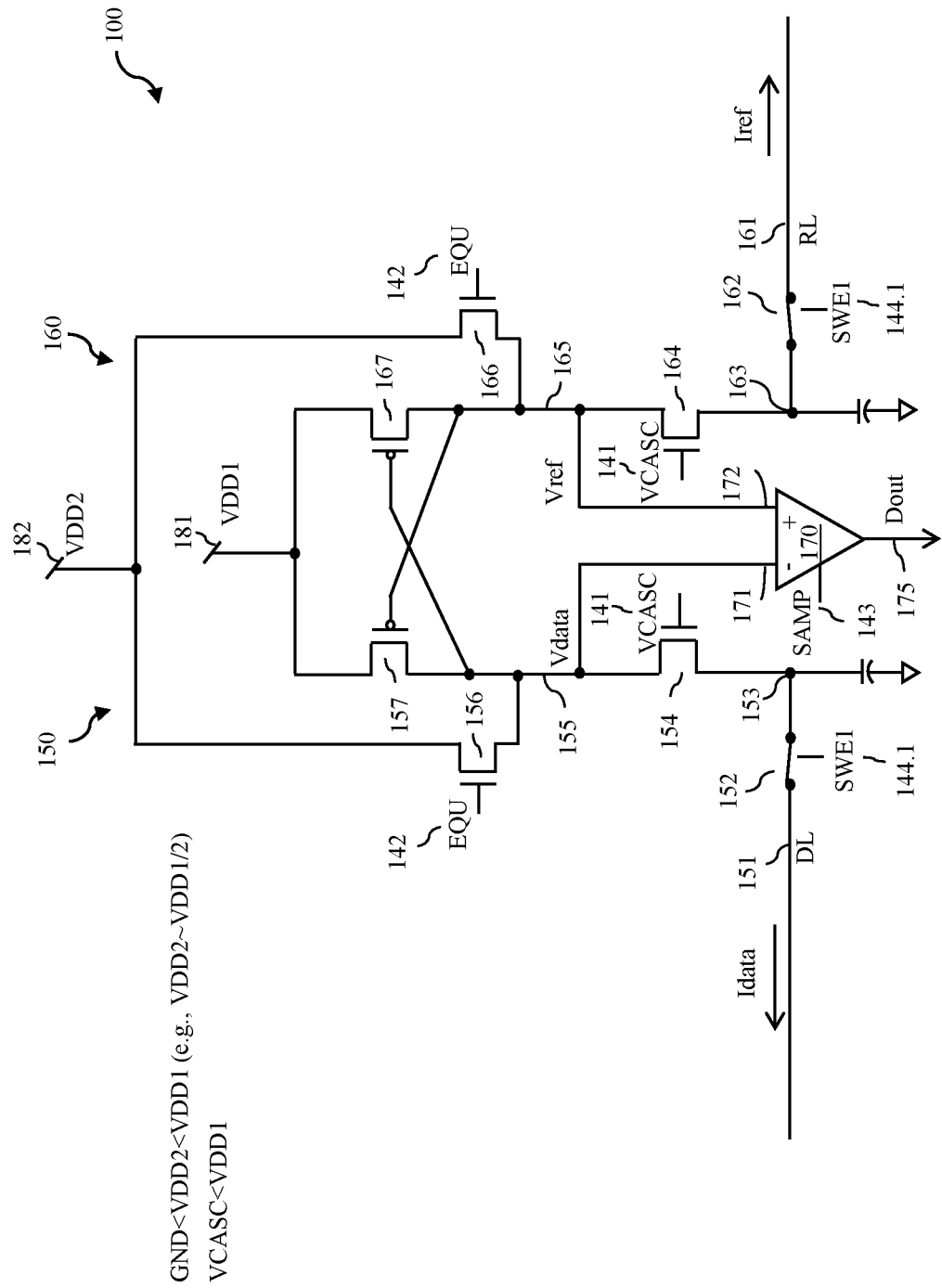
FIG. 1 is a schematic diagram illustrating an embodiment of a multi-rail sense circuit.
Figure 2:
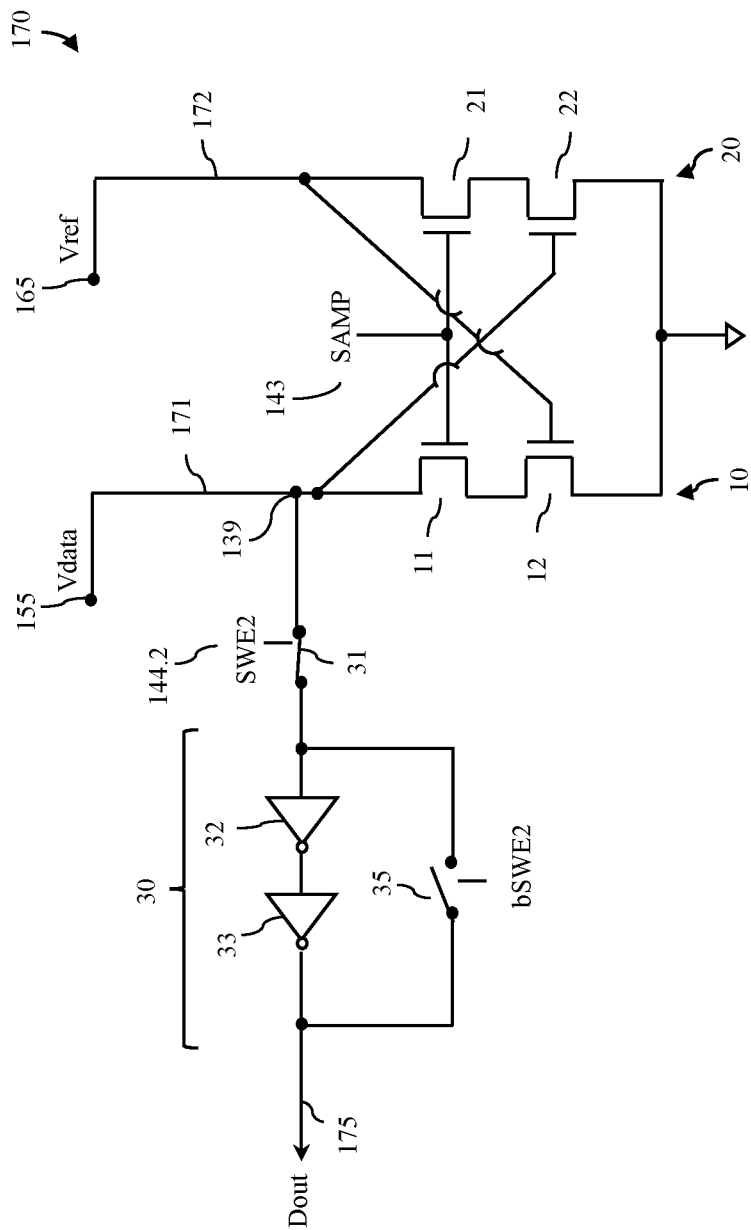
FIG. 2 is a schematic diagram illustrative of a voltage comparator that can be incorporated into this sense circuit of FIG. 1.
Figure 3:
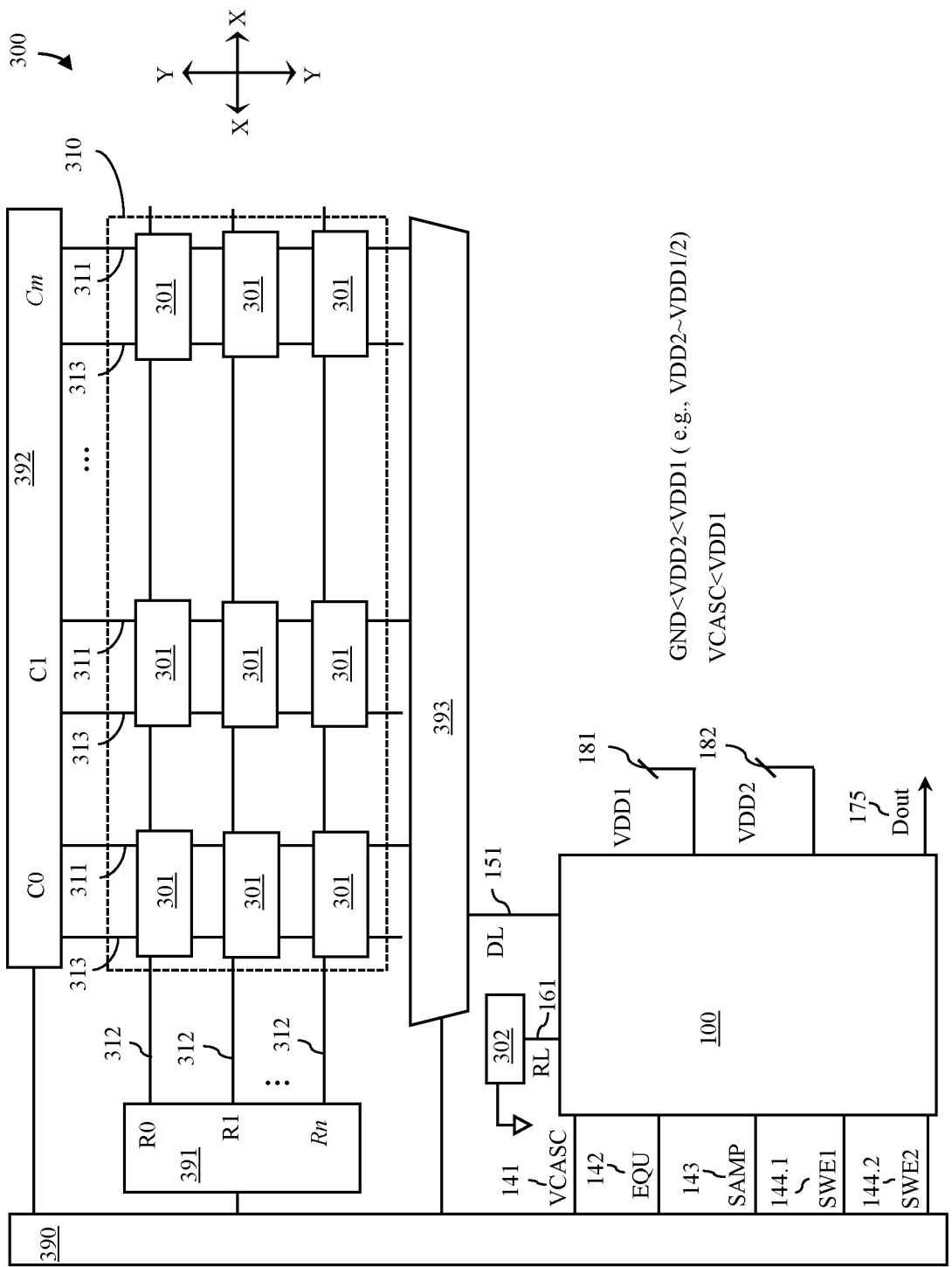
FIG. 3 is a schematic diagram illustrative of an embodiment of a memory structure that can incorporate the sense circuit of FIG. 1.

FIG. 1 is a schematic diagram illustrating an embodiment of a multi-rail sense circuit 100 configured to improve sensing speed and reduce power consumption. FIG. 2 is a schematic diagram illustrative of an example of a voltage comparator 170 that can be incorporated into this sense circuit 100. FIG. 3 is a schematic diagram illustrative of one embodiment of a memory structure 300 that can incorporate a multi-rail sense circuit, such as the multi-rail sense circuit 100 including voltage comparator 170.

Referring to FIG. 3 in combination with FIGS. 1-2, the memory structure 300 can include an array 310 of memory cells 301. Memory cells 301 can be arranged in columns (e.g., see columns C0-Cm) and rows (e.g., see rows R0-Rn). For purposes of illustration, columns are shown in the figures as being oriented in the Y-direction and rows are shown as being oriented in the X-direction. The orientations of the columns and rows as shown in the figures are not intended to be limiting. Alternatively, the columns could be oriented in the X-direction and the rows could be oriented in the Y-direction. In any case, the columns can be essentially perpendicular to the rows with each memory cell 301 being located at an intersection between one column and one row (i.e., with each memory cell 301 being located within one specific column and one specific row).

Memory structure 300 can further include bitlines 311 and source line 313 for the columns C0-Cm, respectively, and wordlines 312 for the rows R0-Rn, respectively. All memory cells 301 in each column can be electrically connected between a source line 313 and a bitline 311 for that column. All memory cells 301 in each row can be electrically connected to the wordline 312 for that row.

Memory cells 301 can be, for example, NVM cells of a type that can be read out using a single-ended sensing scheme. That is, data values stored in the NVM cells can be sensed using a single-ended sensing scheme. Specifically, memory cells 301 can be resistive NVM cells (also referred to herein as resistance-programmable NVM cells). FIG. 4 is a schematic diagram illustrating an example of a resistive NVM cell. This resistive NVM cell can include a programmable resistor 420 (also referred to herein as a variable resistor) and an access transistor 410 (e.g., an N-channel field effect transistor (NFET)), which are connected in series between a bitline 311 and a source line 313 for a column. The programmable resistor 420 can have a first terminal 421 connected to the bitline 311 and a second terminal 422 opposite the first terminal 421. The access transistor 410 can have a drain region connected to the second terminal 422, a source region connected to the source line 313, and a gate connected to a wordline 312 for a row. The programmable resistor 420 can be any type of programmable resistor suitable for use in a resistive NVM cell. For example, the programmable resistor 420 could be a magnetic tunnel junction (MTJ)-type programmable resistor 420A (see FIGS. 5A-5B), a phase change memory (PCM)-type programmable resistor 420B (see FIGS. 6A-6B), or resistive random access memory (RRAM)-type programmable resistor 420C (see FIGS. 7A-7B) or any other suitable type of programmable resistor that is configured so that, by applying specific bias conditions to one or both of the two terminals, the resistance of the resistor can be changed between at least two different stable resistance states. For example, the resistance state of such a programmable resistor can be changed to a high resistance state to store a first logic value or to a low resistance state to store a second logic value. The high resistance state can represent a stored logic value of "1" and the low resistance state can represent a stored logic value of "0" or vice versa.

More specifically, FIGS. 5A-5B illustrate a MTJ-type programmable resistor 420A that could be incorporated into the resistive NVM cell of FIG. 4 (and, thus, used for memory cells 301). Such an MTJ-type programmable resistor 420A is typically a back end of the line (BEOL) multi-layer structure, which includes a free ferromagnetic layer 514 (also referred to as a switchable layer) at the first terminal 421, a fixed ferromagnetic layer 512 (also referred to as a pinned layer) at the second terminal 422, and a thin dielectric layer 513 (e.g., a thin oxide layer) between the free ferromagnetic layer 514 and the fixed ferromagnetic layer 512. Depending upon the biasing conditions on the first terminal 421 and the second terminal 422 during a write operation, the MTJ-type programmable resistor 420A exhibits different resistances (e.g., a low resistance or a high resistance). For example, during a write operation, a high positive supply voltage (VDD) can be applied to the second terminal 422 and the first terminal 421 can be discharged to ground (e.g., at 0V). In this case, current flow through the device causes the free ferromagnetic layer 514 to switch to (or maintain) the anti-parallel resistance (RAP) state (also referred to as a high resistance state), thereby storing the first logic value (e.g., a bit value of "1") (see FIG. 5A). Alternatively, during the write operation, VDD can be applied to the first terminal 421 and the second terminal 422 can be discharged to ground (e.g., at 0V). In this case, current flow through the device causes the free ferromagnetic layer 514 to switch to (or maintain) a parallel resistance (RP) state (also referred as a low resistance state), thereby storing the second logic value (e.g., a bit value "0") (see FIG. 5B).

FIGS. 6A-6B illustrate a PCM-type variable programmable resistor 420B that could be incorporated into the resistive NVM cell of FIG. 4 (and, thus, used for the memory cells 301). Such a PCM-type variable resistor employs a phase change material 611 (e.g., a chalcogenide compound) with programmable structural phases that exhibit different resistances. Switching of the phase is dependent upon the local temperature, which is controlled by the length and strength of an applied voltage. For example, switching from a crystalline to an amorphous phase to store the first logic value (e.g., a bit value of "1") can be achieved by applying a short high voltage pulse to one or both of the terminals 421-422 in order to quickly heat the phase change material above its melting point (see FIG. 6A). Switching from an amorphous phase to the crystalline phase to store the second logic value (e.g., a bit value of "0") can be achieved by applying a longer lower voltage pulse to one or both of the terminals 421-422 in order to heat the phase change material to its crystallization temperature and then allowing it to cool (see FIG. 6B).

FIGS. 7A-7B illustrate a RRAM-type programmable resistor 420C that could be incorporated into a resistive NVM cell of FIG. 4 (and, thus, used for the memory cells 301). Such an RRAM-type programmable resistor is also typically BEOL multi-layer structure, which includes two metal layers 712 and 714 separated by a dielectric layer 713 (e.g., hafnium oxide ($HfO_x$) or some other suitable oxide layer, also referred to as a switching layer). Depending upon the biasing conditions on the first terminal 421 and the second terminal 422 during a write operation, ions in the dielectric layer 713 may migrate to: (a) either break-up a conductive filament between the metal layers 712 and 714 so that the resistor is in a high resistance state, thereby storing the first logic value (e.g., a bit value of "1") or (b) grow a conductive filament 715 in the dielectric layer 713 extending between the metal layers 712 and 714 so that resistor is in a low resistance state, thereby storing the second logic value (e.g., a bit value of "0").

Figure 8:
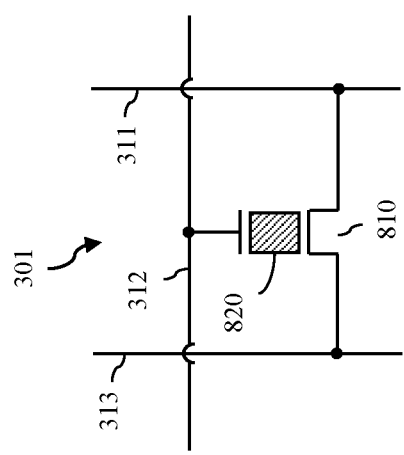
FIG. 8 is a schematic diagram illustrative of a threshold voltage-programmable transistor type memory cell that could be incorporated into the memory structure of FIG. 3.

Alternatively, the memory cells 301 could be memory cells of any other type of NVM cell that can be read out using a single-ended sensing scheme. For example, each memory cell 301 could be a threshold voltage (Vt)-programmable field effect transistor (FET). FIG. 8 is a schematic diagram illustrative of a Vt-programmable FET and, particularly, a Vt-programmable NFET 810. The Vt-programmable NFET 810 can include: a gate 820, which is electrically connected to a wordline 312 for a row; a drain region, which is electrically connected to a bitline 311 for a column; and a source region, which is electrically connected to a source line 313 for the same column. The gate 820 can be configured so that, depending upon biasing conditions applied to the gate, source and drain terminals, the Vt can be selectively programmed (i.e., changed) and, more particularly, the Vt can be switched between a high-Vt state, where the transistor is more resistive, to store the first logic value (e.g., a logic value of "1") and a low-Vt state, where the transistor is less resistive/more conductive, to store the second logic value (e.g., a logic value of "0"). Thus, gate 820 can effectively function as a data storage node. Example Vt-programmable FETs include, but are not limited to, charge trap field effect transistors (CTFETs), ferroelectric field effect transistors (FeFETs), and floating gate field effect transistors (FGFETs). Such Vt-programmable FETs are well known in the art and, thus, the details thereof are omitted from this specification in order to allow the reader to focus on the salient aspects of the disclosed embodiments.

Referring again to FIG. 3, the memory structure 300 can further include a controller 390 and peripheral circuitry 391-393 and 100 in communication with the controller 390, connected to the array 310 and configured to facilitate memory cell operations (e.g., write and read) in response to various control signals from the controller 390. The peripheral circuitry can include a row control block 391, which is electrically connected to the WLs 312 for the rows, and which includes, for example, address decode logic and wordline drivers for appropriately biasing specific wordlines depending upon the type of memory cell and the mode of operation. The peripheral circuitry can also include a column control block 392, which is electrically connected to bitlines 311 and source lines 313 for the columns and which includes, for example, column address decode logic and bitline drivers and, source line drivers for appropriately biasing specific bitlines and source lines depending upon the type of memory cell and the mode of operation. The peripheral circuitry can also include column decoder 393. The column decoder 393 can include, for example, column address decode logic and at least one multiplexor (MUX). Each MUX can have multiple bitline inputs connected to multiple bitlines for multiple columns. Each MUX can further have an output connected to a first input line 151 (also referred to herein as a data line (DL)), which is connected or connectable to a sense circuit 100. Each MUX can be configured to selectively connect a specific bitline for a specific column to the DL 151 and, thereby to the sense circuit during a sensing operation (also referred to herein as a read operation) directed to a selected memory cell 301 in the array 310 and located in the specific column and at a specific row. For purposes of illustration, FIG. 3 shows a single MUX configured to connect any one of the bitlines in the memory array to the data line 151. However, it should be understood that the figures are not intended to be limiting. Other memory structure embodiments could include multiple MUXs connected to multiple sense circuits, respectively, by corresponding DLs. In this case, each MUX connected to a sense circuit could be connected to a subset of the bitlines (e.g., two bitlines for two columns, four bitlines for four columns, etc.) and can be configured to selectively connect one specific bitline of the subset to a corresponding DL during a sensing operation. The peripheral circuitry features described above are well known in the art and, thus, the details thereof have been omitted from the specification to allow the reader to focus on the salient aspects of the disclosed embodiments.

Referring to FIGS. 1-2 in combination with FIG. 3, the peripheral circuitry can also include a sense circuit 100, which is also referred to herein as a multi-rail sense circuit because it is connected to multiple voltage rails. These voltage rails can include a first voltage rail 181 at a first voltage level and, particularly, at a first positive supply voltage level (VDD1) and a second voltage rail 182 at a second voltage level and, particularly, at a second positive supply voltage level (VDD2) that is different from VDD1. For example, VDD2 can be less than VDD1 and, more particularly, can be between ground (GND) and VDD1. In some embodiments VDD2 can be set so that it is at a level approximately midway between GND and VDD1 (e.g., VDD2~½*VDD1). Thus, for example, if VDD1 is in the range of 1.6V to 1.7V (e.g., 1.65V), then VDD2 could be in the range of 0.525V-1.125V (e.g., 0.825V).

Generally, sense circuit 100 can include a pair of sense nodes and, particularly, a first sense node 155 (which is also referred to herein as a data sense node) and a second sense node 165 (which is also referred to herein as a reference sense node). A pair of cross-coupled transistors 157 and 167 can be electrically connected to the sense nodes 155 and 165, respectively, and to the first voltage rail 181. A pair of pre-charge transistors 156 and 166 can be electrically connected to the sense nodes 155 and 165, respectively, and to the second voltage rail 182. During a sensing operation, the first voltage rail at VDD1 can be used to power the sense circuit 100 and, in response to received inputs (e.g., data current (Idata) and reference current (Iref), as discussed in greater detail below), generate a voltage differential (Vdiff) between Vdata and Vref on the sense nodes 155 and 165, respectively. A voltage comparator 170 can sample Vdata and Vref and, based on a detectable voltage differential (minVdiff) (e.g., 110 mV-140 mV, e.g., ~115 mV) either maintain or switch the value of a data output value (Dout) at an output 175 to a high or low Dout. To increase the speed at which minVdiff between Vdata and Vref develops in the sense circuit 100 during the sensing operation, an equalization process can be performed upon the initiation of the sensing operation. In this equalization process, the pre-charge transistors 156 and 166 can be pulsed on and off to quickly equalize Vdata and Vref on the sense nodes 155 and 165 to VDD2. After equalization, Vdata and Vref only need to be pulled up or down some small number of millivolts from VDD to achieve minVdiff. As a result, sampling of Vdata and Vref by the voltage comparator 170 can be performed earlier in time after the initiation of the sensing operation (e.g., less than 5 ns or even less than 4 ns, such as at 3.6 ns, as opposed to 14 ns or more). Thus, the overall time required for performing the sensing operation and for powering the sense circuit is reduced (i.e., sensing speed is increased and power consumption is reduced).

More particularly, the sense circuit 100 can include a first section 150 (e.g., a data section) and a second section 160 (e.g., a reference section), each including multiple transistors (e.g., multiple metal oxide semiconductor field effect transistors (MOSFETs).

First section 150 can include a first transistor 157 (e.g., a P-channel MOSFET), a second transistor 154 (e.g., an N-channel MOSFET), and a third transistor 156 (e.g., another N-channel MOSFET). First transistor 157 can be electrically connected in series between the first voltage rail 181 and the second transistor 154 and a first sense node 155 (also referred to herein as the data sense node) can be at a junction between the first transistor 157 and the second transistor 154. Second transistor 154 (also referred to herein as a sense enable transistor) can have a gate connected to receive a gate bias voltage signal (VCASC) 141 (e.g., from controller 390). Third transistor 156 can be electrically connected between the second voltage rail 182 and the first sense node 155 and can have a gate connected to receive an equalization enable signal (EQU) 142 such that it is one of the pre-charge transistors mentioned above. First section 150 can further include a first input node 153 (also referred to herein as a data input node), which is located at a junction between the second transistor 154 and ground and which is connectable (e.g., by a first switch 152) to a first input line 151 (also referred to herein as a data line (DL)). First switch 152 can be, for example, an N-channel MOSFET or some other suitable type of switch structure configured to selectively, electrically connect DL 151 to the data input node 153 in response to a switch enable signal 144.1 (SWE1) (e.g., from the controller 390). As illustrated in FIG. 3, DL 151 can be connected to MUX 393, which, as discussed in greater detail below will selectively connect the DL 151 to a specific bitline and, thereby, to a selected memory cell for sensing the stored data value of the selected memory cell during a sensing operation.

Second section 160 can include a fourth transistor 167 (e.g., a P-channel MOSFET), a fifth transistor 164 (e.g., an N-channel MOSFET), and a sixth transistor 166 (e.g., another N-channel MOSFET). Fourth transistor 167 can be electrically connected in series between the first voltage rail 181 and the fifth transistor 164 and a second sense node 165 can be at a junction between the fourth transistor 167 and the fifth transistor 164. Fifth transistor 164 (e.g., another sense enable transistor) can have a gate that is also connected to receive VCASC 141. Thus, the second and fifth transistors 154 and 164 (i.e., the sense enable signals) are controlled by the same VCASC 141. Sixth transistor 166 can be electrically connected between the second voltage rail 182 and the second sense node 165 and can have a gate connected to receive an EQU 142 such that it is another one of the pre-charge transistors mentioned above. Second section 160 can further include a second input node 163 (also referred to herein as a reference input node), which is located at a junction between the fifth transistor 164 and ground and which is connectable (e.g., by a second switch 162) to a second input line 161 (also referred to herein as a reference line (RL)). Second switch 162 can be essentially the same as the first switch 152 such that it is configured to selectively, electrically connect RL 161 to the reference input node 163, also in response to SWE1 144.1. As illustrated in FIG. 3, RL 161 can be electrically connected to a reference cell 301. This reference cell 301 can, for example, be a resistor that is connected between RL 161 and ground and that has a fixed or programmable resistance that is approximately half-way between high and low resistance states of the memory cells 301. For example, if a high resistance state of a memory cell 301, which represents a stored logic value of "1", is approximately 100 kOhms and a low resistance state, which represents a stored logic value of "0", is approximately 10 kOhms, then the fixed or programmed resistance of the reference cell 302 can be approximately 50 kOhms.

Additionally, it should be noted that the first transistor 157 within the first section 150 and the fourth transistor 167 within the second section 160 can be cross-coupled transistors. For example, as mentioned above, the first transistor 157 and the fourth transistor 167 can be P-channel MOSFETs. They can have source regions electrically connected to the first voltage rail 181 and drain regions electrically connected to the first sense node 155 and the second sense node 165, respectively. Additionally, a gate of the first transistor 157 can be electrically connected to the second sense node 165 (i.e., at the drain region of the fourth transistor 167) and a gate of the fourth transistor 167 can be electrically connected to the first sense node 155 (i.e., at the drain region of the first transistor 157) such that the first transistor 157 and the second transistor 167 are cross-coupled.

The sense circuit 100 can further include a voltage comparator 170, as shown in FIG. 1 and as illustrated in greater detail in FIG. 2. Voltage comparator 170 can have two sections 10 and 20. Section 10 can include a seventh transistor 11 and an eighth transistor 12 electrically connected in series between the first voltage input 171 (which as mentioned above is connected to the data sense node 155) and ground. Section 20 can include a ninth transistor 21 and a tenth transistor 22 electrically connected in series between the second voltage input 172 (which as mentioned above is connected to the reference sense node 165) and ground. These transistors 11, 12, 21 and 22 can all be, for example, N-channel MOSFETs. The gates of the seventh transistor 11 and the ninth transistor 21 can be connected to receive a sampling enable signal (SAMP) 143 (e.g., from the controller 390). SAMP 143 can control the ON/OFF states of the seventh and ninth transistors (i.e., whether they conductive or not) and, thereby the ON/OFF state of the voltage comparator 170 (i.e., whether it is operational for performing a voltage comparison or not). Additionally, the eighth transistor 12 and the tenth transistor 22 can be cross-coupled with a gate of the tenth transistor 22 being electrically connected to the first voltage input 171 (and thereby the first sense node 155) and a gate of the eighth transistor 12 being electrically connected to the second voltage input 172 (and thereby the second sense node 165). The voltage comparator 170 can further include an output section 30. The output section 30 can include a pair of series-connected inverters 32-33 with an input end connectable (e.g., by a switch 31) to an intermediate node 139, which is located between the first voltage input 171 and the seventh transistor 11, and an output end electrically connected to the output 175. The output section 30 can further include a switched feedback path between the input and output ends of the pair of series-connected inverters 32-33. That is, the input end and the output end of the series-connected inverters 32-33 are connectable (e.g., by a switch 35). The switches 31 and 35 can be essentially the same type of switch (e.g., both N-channel MOSFETs or both P-channel MOSFETs) controlled by two different switch enable signals, such as a second switch enable signal 144.2 (SWE2) (e.g., from the controller 390) and an inverted second switch enable signal (bSWE2) generated by an inverter in response to SWE2, such that, when switch 31 is open, switch 35 is closed and vice versa. Alternatively, the switches 31 and 35 can be different types of switches (e.g., a P-channel MOSFET and an N-channel MOSFET) controlled by the same signal SWE2 144.2 such that, when switch 31 is open, switch 35 is closed and vice versa.

Before a sensing operation, Vdata and Vref on the sense nodes 155 and 165 in the sense circuit 100 will initially be at GND and VDD1 or vice versa, depending upon the results of a previous sensing operation. Additionally, in the output section 30 of the voltage comparator 170, switch 31 will be open such that the series-connected inverters 32-33 are disconnected from the intermediate node 139 and switch 35 will be closed so the feedback path electrically connects the input and output ends of the series-connected inverters 32-33 and Dout from the previous sensing operation remains stable.

Then, during a sensing operation of a selected memory cell 301 in a given column and a given row of the memory structure 300, control signals from the controller 390 can cause the wordline voltage on the wordline 312 for the row to go high and the MUX 393 to selectively connect the bitline 311 for the column to the DL 151. SWE1 causes the switches 152 and 162 to electrically connect DL 151 to the data input node 153 and RL 161 to the reference input node 163, respectively. VCASC 141 goes high, turning on the second and fifth transistors 154 and 164 (i.e., the sense enable transistors) and, thereby turning on the sense circuit 100. As a result of turning on the sense enable transistors 154 and 164, Idata begins to flow through the first section 150, DL 151, and selected memory cell 301 to ground and Iref begins to flow through the second section 160, RL 161, and reference cell 302 to ground. If the selected memory cell is in the high resistance state (representative of a stored logic value of "1"), Idata<Iref. If the selected memory cell is in the low resistance state (representative of the stored logic value of "0"), Idata>Iref. The cross-coupled transistors 157 and 167 will begin to develop a new voltage differential (Vdiff) between Vdata and Vref on the sense nodes 155 and 165, respectively, as a function of the difference between Idata and Iref. It should be noted that VCASC 141 is a gate vias voltage that controls the sense enable transistors 154 and 164 and thereby the current flow through the selected memory cell and the reference cell to avoid read disturbance during the sensing operation. The high value of VCASC 141 can be less than VDD1. For example, as mentioned above VDD1 can be in the range of 1.6V to 1.7V, whereas VCASC can be in the range of, for example, 0.5V to 0.7V across process voltage and temperatures.

At or near the time when VCASC 141 goes high, a sense node voltage equalization process is also performed. Specifically, EQU 142 will go high for a short period of time, cycling the pre-charge transistors 156 and 166 on and off again to quickly equalize Vdata and Vref to VDD2. Following this sense node voltage equalization, if Idata<Iref, Vdata will begin to be pulled up toward VDD1 from VDD2 and Vref will begin to be pulled down toward ground from VDD2. If Idata>Iref, Vref will begin to be pulled up toward VDD1 from VDD2 and Vdata will begin to be pulled down toward ground from VDD2.

Once enough time has passed for minVdiff (e.g., 110 mV-140 mV, e.g., ~115 mV) between Vdata and Vref to be developed, Vdata and Vref can be sampled by voltage comparator 170. As mentioned above, due to the sense node voltage equalization process, voltage sampling by the voltage comparator 170 can be performed in a relative short period of time (e.g., less than 5 ns or even less than 4 ns, such as at 3.6 ns, as opposed to 14 ns or more).

For voltage sampling, SAMP 143 goes high, turning on the seventh transistor 11 and the ninth transistor 21, and thereby turning on the voltage comparator 170. If Vdata>Vref, the tenth transistor 22 will be on and the eight transistor 12 will be off, so the voltage level at the intermediate node 139 will stay high. If Vdata<Vref, the eighth transistor 12 will be on and the tenth transistor 22 will be off, so the intermediate node 139 will stay low. When the voltage on the intermediate node 139 is stable, SWE2 is switched to disconnect the feedback path and electrically connect the intermediate node 139 to the series-connected inverters 32-33. Thus, if the resistance state of the selected memory cell is high (representative of the stored logic value of "1"), then at the time of sampling by the voltage comparator 170, Vdata will be high, the voltage on the intermediate node 139 will be high, and Dout will be a logic "1". If the resistance state of the selected memory cell is low (representative of the stored logic value of "0"), then at the time of sampling by the voltage comparator 170, Vdata will be low, the voltage on the intermediate node 139 will be low, and Dout will be a logic "0".

Figure 9:
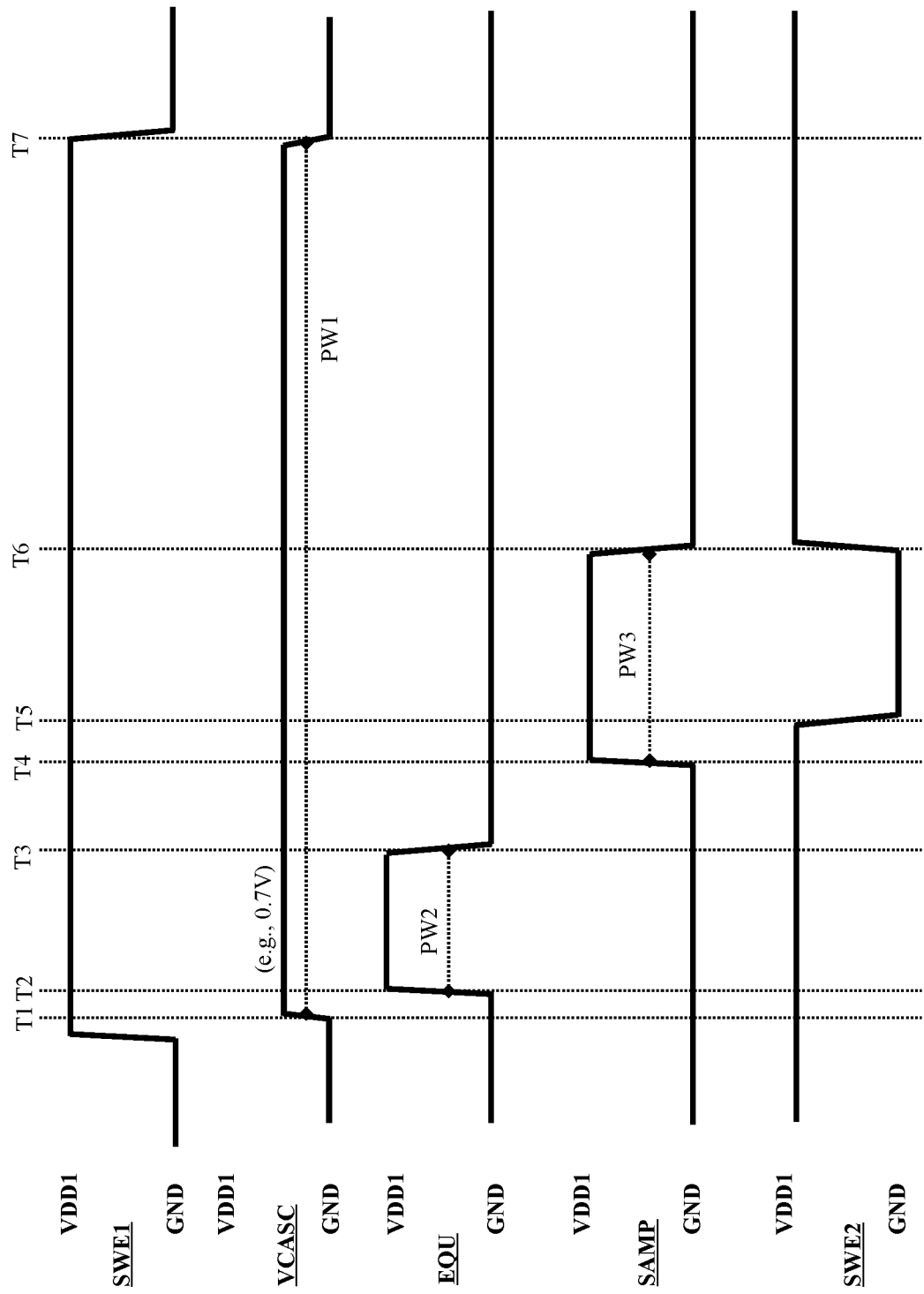
FIG. 9 is a timing diagram illustrating controls signal employed during operation of the disclosed embodiments.

FIG. 9 is a timing diagram illustrating the various control signals mentioned above during the sensing operation including, but not limited to, SWE1 144.1, VCASC 141, EQU 142, SAMP 143, and SWE2 144.2, as discussed above. For purposes of this example, the switches 152 and 162 are N-channel MOSFETs such that they turn on when SWE1 is high and off when SWE1 is low. Additionally, for purposes of this example, the switch 31 is a P-channel MOSFET turning on when SWE2 is low. As illustrated, VCASC 141 has a pulse with a first rising edge, which corresponds to the initiation of a sensing operation (e.g., at time T1) and a first falling edge, which corresponds to the completion of the sensing operation (e.g., at time T7), such that a first pulse width (PW1) of VCASC 141 is equal to T7-T1. Just before (or concurrent with) the first rising edge, SWE1 goes high and, just after or concurrent with the first falling edge, SWE1 goes low, causing the switches 152 and 162 to disconnect the sense circuit 100 from DL 151 and RL 161, respectively.

EQU 142 has a pulse with a second leading edge, which occurs approximately concurrent with the first rising edge of VCASC 141 (i.e., at the same time T1 or within a nanosecond (ns) thereafter at time T2) and a second falling edge, which occurs early in the sensing operation (e.g., during the first half, the first third, the first quarter, etc. of the sensing operation) such that a second pulse width (PW2) of EQU 142 is equal to T3-T2 (or T3-T1, depending upon the second rising edge position) and is specifically less than half of PW1. The detectable voltage differential (minVdiff) between Vdata and Vref will be reached by time T4.

Following equalization and once a detectable voltage differential (minVdiff) has been reached (e.g., at time T4), SAMP 143 is pulsed. Specifically, SAMP 143 has a pulse with a third leading edge at time T4, which occurs some predetermined period of time after the second falling edge of EQU 142 at T3 sufficient for minVdiff to develop, and a third falling edge at time T6, which occurs some predetermined period of time prior to the first falling edge of VCASC 141 at time T7. Thus, the pulse for SAMP 143 occurs between and is separated in time from the second falling edge of the EQU and the first falling edge of VCASC. Additionally, shortly after the third rising edge of SAMP 143 at time T4, SWE2 goes low, and output 175 outputs a new Dout. A third pulse width (PW3) of SAMP 143 should be sufficiently long to ensure capture of a new/stable Dout at the output 175. The falling edge of SAMP 143 and SWE2 144.2 can essentially coincide.

Figure 10:
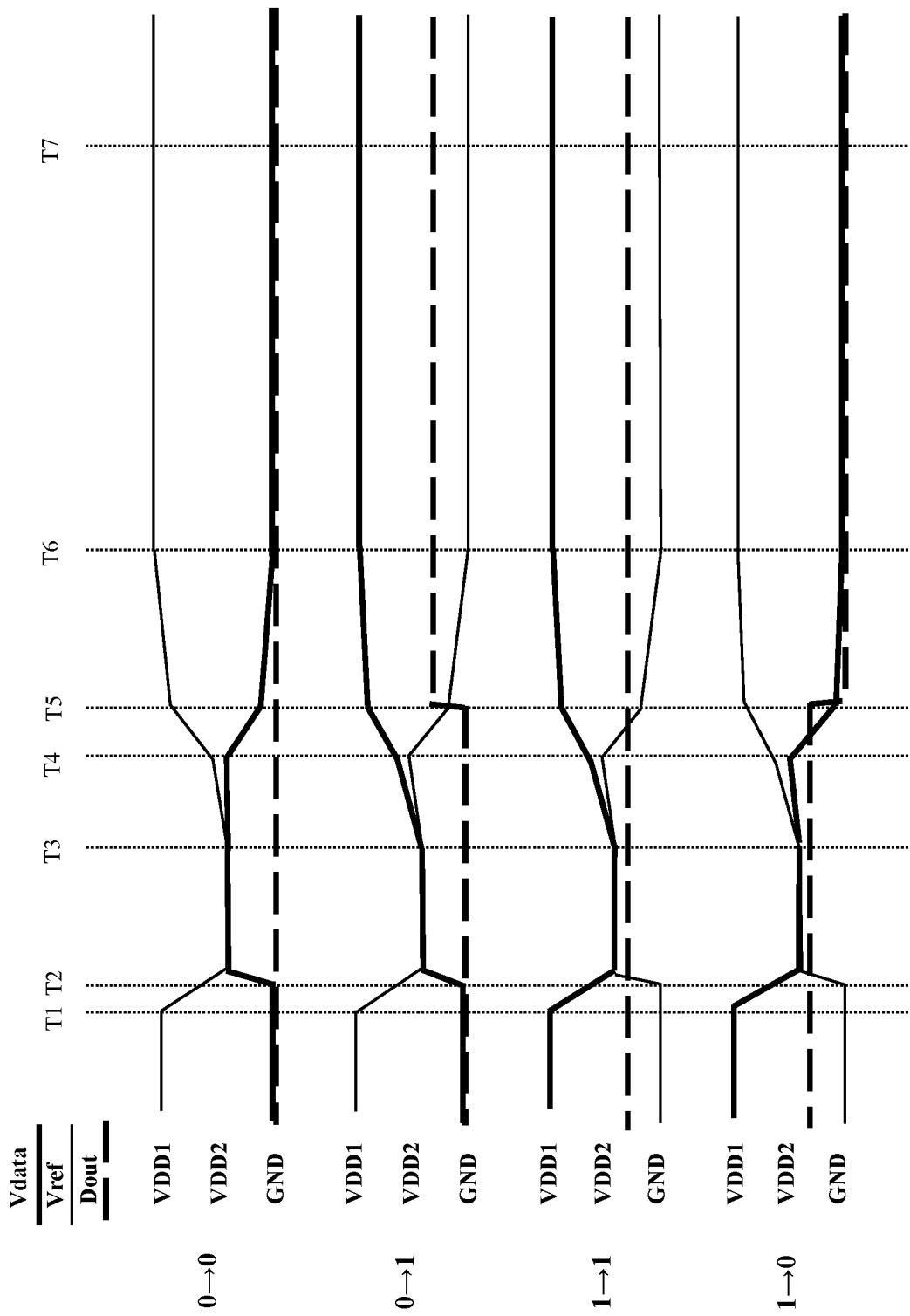
FIG. 10 includes a set of voltage diagrams associated with sensing operations including equalization according to the disclosed embodiments.

FIG. 10 shows a set of voltage diagrams, each illustrating changes in Vdata, Vref, and Dout during a sensing operation performed as described above, including the sense node equalization process upon the initiation of the sensing operation. Each diagram in the set references the same times T1-T7 discussed above and illustrated in FIG. 9. Additionally, each diagram in the set corresponds to one of four conditions that can occur: Dout of 0 staying Dout of 0, Dout of 0 transitioning to Dout of 1, Dout of 1 staying Dout of 1, or Dout of 1 transitioning to Dout of 0. As shown, due to the sense node voltage equalization process, minVdiff between Vdata and Vref can be developed on the sense nodes 155 and 165 by time T4 and captured and output by the voltage comparator 170 by time T5. As mentioned above and illustrated in these diagrams, in some embodiments, time T1 to time T4 (when minVdiff between Vdata and Vref is developed) can be less than 5 ns or even less than 4 ns (e.g., 3.6 ns).

Figure 11:
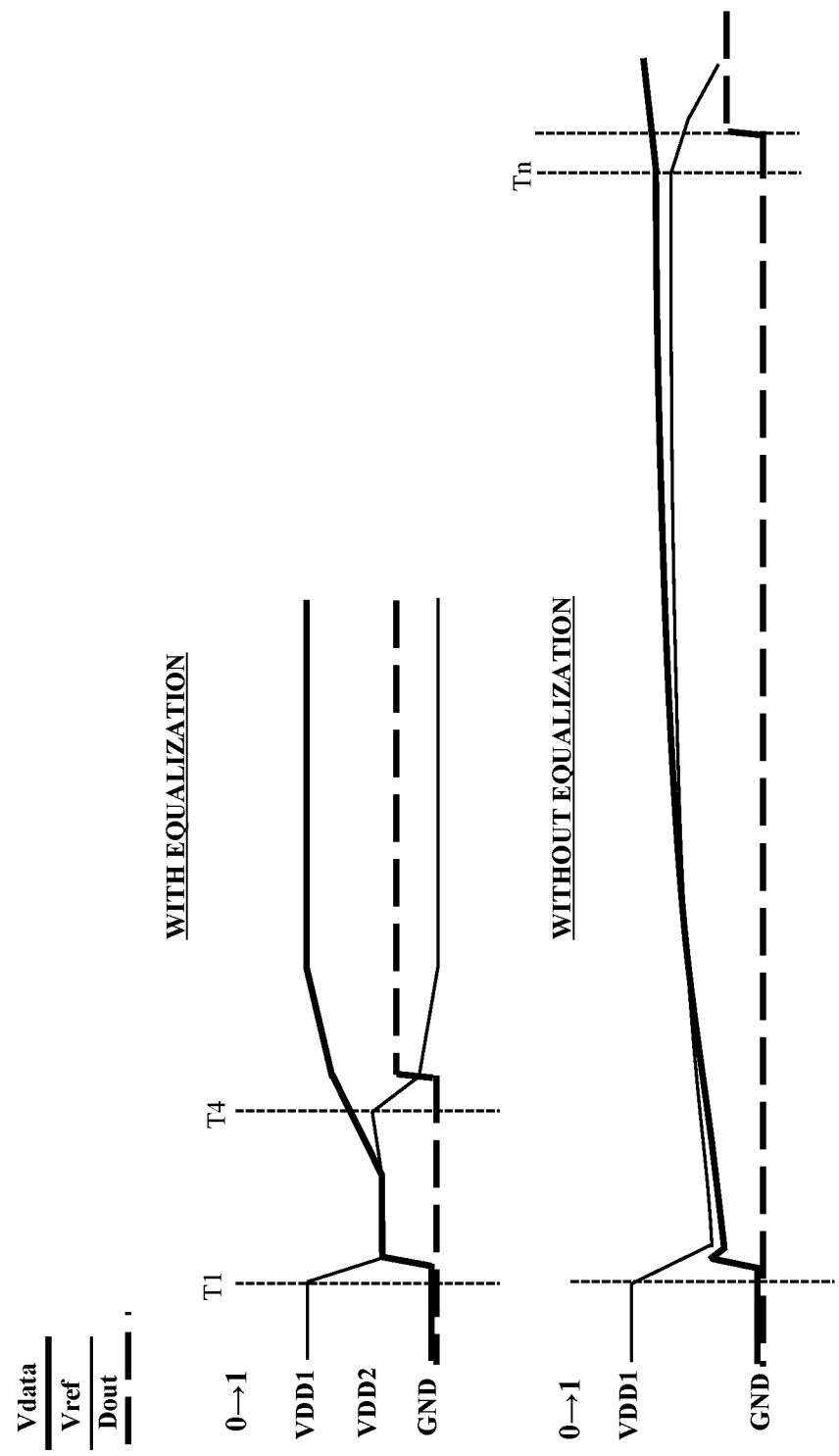
FIG. 11 includes voltage diagrams associated with sensing operations with and without equalization, respectively.

FIG. 11 shows another set of voltage diagrams, each again illustrating changes in Vdata, Vref, and Dout during a sensing operation: one performed, as described above, including the sense node equalization process upon the initiation of the sensing operation and showing the min Vdiff at time T4 and transition from Dout of 0 to Dout of 1 at time T5; and the other performed without the equalization process and showing the minVdiff occurring significantly later in time (e.g., at time Tn, such as approximately 18 ns after initiation of the sensing operation) and the subsequent transition from Dout of 0 to Dout of 1.

It should be understood that example values provided above for minVdiff and the period of time required to develop minVdiff with or without the sense node equalization process are offered for illustration purposes and are not intended to be limiting. Those skilled in the art will recognize that such specifications will vary be on a number of factors, including but not limited to, operating temperature, VDD1, VDD2, the reference resistance, the programmable resistances of the memory cells, etc.

Additionally, for purposes of illustration, the sense circuit 100 of FIG. 1 is described above as being incorporated into a memory structure 300, such as that shown in FIG. 3, where single-ended sensing is required for reading out stored data values in memory cells 301 (e.g., in NVM cells). However, alternatively, such a sense circuit could instead be incorporated into a memory structure where dual-ended sensing is required for reading out stored data values in memory cells (e.g., in static random access memory (SRAM) cells). Those skilled in the art will recognize that, while in single-ended sensing, parameter values on a data line connected to a memory cell and a reference line connected to a reference cell are compared, whereas in dual-ended sensing parameter values on a pair of complementary bitlines connected to a memory cell are compared. Thus, in a dual-ended sensing operation using a disclosed sense circuit similar to the sense circuit 100 described above and illustrated in FIG. 1, a stored data value in a selected SRAM cell can be determined based on a voltage differential on the sense nodes generated using parameter input values from a pair of complementary bitlines (blt and blc), as opposed to a data line and a reference line. Instead of using VDD2 and pre-charge transistors to increase the time it takes to develop a minVdiff between Vdata and Vref on the sense nodes as a function of Idata and Iref, as described above, such features could be used to increase the time it takes to develop a minVdiff between two bitline voltages (Vblt and Vblc) on sense nodes as a function Iblt and Iblc.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
  a first voltage rail at a first voltage level;
  a second voltage rail at a second voltage level different from the first voltage level; and
  a sense circuit including:

sense nodes;
cross-coupled transistors electrically connected to the sense nodes, respectively, and to the first voltage rail;
pre-charge transistors electrically connected to the sense nodes, respectively, and to the second voltage rail;
input nodes connectable to receive a data input and a reference input, respectively; and
sense enable transistors connected between the sense nodes and the input nodes, respectively,
wherein the sense nodes include a first sense node and a second sense node,
wherein the sense circuit further includes:
a first section including a first transistor, a second transistor, and a third transistor; and
a second section including a fourth transistor, a fifth transistor, and a sixth transistor,
wherein the first transistor is electrically connected in series between the first voltage rail and the second transistor,
wherein the third transistor is electrically connected between the second voltage rail and the first sense node, the third transistor being at a junction between the first transistor and the second transistor,
wherein the fourth transistor is electrically connected in series between the first voltage rail and the fifth transistor,
wherein the sixth transistor is electrically connected between the second voltage rail and the second sense node, the second sense node being at a junction between the fourth transistor and the fifth transistor,
wherein the first transistor and the fourth transistor are the cross-coupled transistors with a gate of the first transistor electrically connected to the second sense node and a gate of the fourth transistor electrically connected to the first sense node,
wherein the third transistor and the sixth transistor are the pre-charge transistors,
wherein the second transistor and the fifth transistor are the sense enable transistors,
wherein the input nodes include a first input node and a second input node,
wherein the first section further includes the first input node between the second transistor and ground and connectable to a first input line, and
wherein the second section further includes the second input node between the fifth transistor and ground and connectable to a second input line.

2. The structure of claim 1,
wherein the first voltage level and the second voltage level are positive voltages, and
wherein the second voltage level is approximately half the first voltage level.

3. The structure of claim 1, wherein the first input line is further connectable to a bitline in a memory structure and the second input line is electrically connected to a reference cell.

4. The structure of claim 3,
wherein the bitline is connected to a memory cell with two different programmable resistance states, and
wherein the reference cell comprises a resistor with a resistance between the two different programmable resistance states.

5. The structure of claim 1,
wherein gates of the second transistor and the fifth transistor are connected to receive a gate bias voltage signal having a first leading edge, a first falling edge, and a first pulse width,
wherein the gate bias voltage signal is lower than the first voltage level,
wherein gates of the third transistor and the sixth transistor are connected to receive an equalization enable signal having a second leading edge, a second falling edge, and a second pulse width that is less than half the first pulse width, and
wherein the first leading edge and the second leading edge are approximately concurrent.

6. The structure of claim 5,
wherein the sense circuit further includes a voltage comparator having a first voltage input electrically connected to the first sense node and a second voltage input electrically connected to the second sense node,
wherein an ON/OFF state of the voltage comparator is controlled by a sampling enable signal, and
wherein a pulse of the sampling enable signal occurs between and is separated in time from the second falling edge of the equalization enable signal and the first falling edge of the gate bias voltage signal.

7. The structure of claim 6, wherein the voltage comparator includes:
a seventh transistor and an eighth transistor electrically connected in series between the first voltage input and ground; and
a ninth transistor and a tenth transistor electrically connected in series between the second voltage input and ground,
wherein gates of the seventh transistor and the ninth transistor are connected to receive the sampling enable signal, and
wherein the eighth transistor and the tenth transistor are cross-coupled with a gate of the tenth transistor electrically connected to the first voltage input and a gate of the eighth transistor electrically connected to the second voltage input.

8. The structure of claim 7, wherein the first transistor and the fourth transistor comprise P-channel transistors and wherein the second transistor, the third transistor, the fifth transistor, the sixth transistor, the seventh transistor, the eighth transistor, the ninth transistor, and the tenth transistor comprise N-channel transistors.

9. The structure of claim 7,
wherein the voltage comparator further includes an output section electrically connected to an intermediate node between the first voltage input and the seventh transistor, and
wherein the output section includes a pair of series-connected inverters connectable between the intermediate node and an output.

10. A structure comprising:
an array of memory cells in columns and rows;
bitlines for the columns, respectively, wherein each memory cell in a column is electrically connected to a bitline for the column;
a multiplexor electrically connected to at least some of the bitlines;
a first voltage rail at a first voltage level;
a second voltage rail at a second voltage level different from the first voltage level; and
a sense circuit connectable by the multiplexor to a bitline and including:
sense nodes;
cross-coupled transistors electrically connected to the sense nodes, respectively, and to the first voltage rail;

pre-charge transistors electrically connected to the sense nodes, respectively, and to the second voltage rail;
input nodes connectable to receive a data input and a reference input, respectively; and
sense enable transistors connected between the sense nodes and the input nodes, respectively,
wherein the sense nodes include a first sense node and a second sense node,
wherein the sense circuit further includes:
a first section including a first transistor, a second transistor, and a third transistor; and
a second section including a fourth transistor, a fifth transistor, and a sixth transistor,
wherein the first transistor is electrically connected in series between the first voltage rail and the second transistor,
wherein the third transistor is electrically connected between the second voltage rail and the first sense node, the first sense node being at a junction between the first transistor and the second transistor,
wherein the fourth transistor is electrically connected in series between the first voltage rail and the fifth transistor,
wherein the sixth transistor is electrically connected between the second voltage rail and the second sense node, the second sense node being at a junction between the fourth transistor and the fifth transistor,
wherein the first transistor and the fourth transistor are the cross-coupled transistors with a gate of the first transistor electrically connected to the second sense node and a gate of the fourth transistor electrically connected to the first sense node,
wherein the third transistor and the sixth transistors are the pre-charge transistors,
wherein the second transistor and the fifth transistor are the sense enable transistors,
wherein the input nodes include a first input node and a second input node,
wherein the first section further includes the first input node between the second transistor and ground and connectable to a first input line,
wherein the second section further includes the second input node between the fifth transistor and ground and connectable to a second input line,
wherein the first input line is connected to the bitline through the multiplexor and the second input line is electrically connected to a reference cell,
wherein gates of the second transistor and the fifth transistor are connected to receive a gate bias voltage signal having a first leading edge, a first falling edge, and a first pulse width,
wherein gates of the third transistor and the sixth transistor are connected to receive an equalization enable signal having a second leading edge, a second falling edge, and a second pulse width that is less than half the first pulse width, and
wherein the first leading edge and the second leading edge are approximately concurrent.

11. The structure of claim 10,
wherein the first voltage level and the second voltage level are positive voltages, and
wherein the second voltage level is approximately half the first voltage level.

12. The structure of claim 10,
wherein the sense circuit further includes a voltage comparator having a first voltage input electrically connected to the first sense node and a second voltage input electrically connected to the second sense node,
wherein an ON/OFF state of the voltage comparator is controlled by a sampling enable signal, and
wherein a pulse of the sampling enable signal occurs between and is separated in time from the second falling edge of the equalization enable signal and the first falling edge of the gate bias voltage signal.

13. The structure of claim 10, further comprising:
wordlines for the rows, respectively; and
source lines for the columns, respectively,
wherein each memory cell in a given row and a given column includes:
an access transistor having a gate electrically connected to a wordline for the given row; and
a programmable resistor, wherein the access transistor and the programmable resistor are electrically connected in series between a source line and a bitline for the given column.

14. The structure of claim 13, wherein each programmable resistor is any of a resistive random access memory-type programmable resistor, a phase change memory-type programmable resistor, and a magnetic tunnel junction-type programmable resistor.

15. The structure of claim 10, further comprising:
wordlines for the rows, respectively; and
source lines for the columns, respectively,
wherein each memory cell in a given row and a given column includes a threshold voltage programmable transistor with a gate connected to a wordline for the given row and with source/drain regions connected to a source line and a bitline for the given column.

16. A structure comprising:
an array of memory cells in columns and rows;
bitlines for the columns, respectively, wherein each memory cell in a column is electrically connected to a bitline for the column;
a multiplexor electrically connected to at least some of the bitlines;
a first voltage rail at a first voltage level;
a second voltage rail at a second voltage level different from the first voltage level;
a sense circuit connectable by the multiplexor to a bitline and including:
sense nodes;
cross-coupled transistors electrically connected to the sense nodes, respectively, and to the first voltage rail;
pre-charge transistors electrically connected to the sense nodes, respectively, and to the second voltage rail;
input nodes connectable to receive a data input and a reference input, respectively,
sense enable transistors electrically connected to the sense nodes and the input nodes, respectively; and
a voltage comparator having voltage inputs connected to the sense nodes, respectively; and
a controller in communication with the sense circuit, wherein the controller generates and outputs multiple control signals to the sense circuit,
wherein the sense nodes include a first sense node and a second sense node,
wherein the sense circuit further includes:
a first section including a first transistor, a second transistor, and a third transistor; and
a second section including a fourth transistor, a fifth transistor, and a sixth transistor, wherein the first transistor is electrically connected in series between the first voltage rail and the second transistor, wherein the third transistor is electrically connected between the second voltage rail and the first sense node, the first sense node being at a junction between the first transistor and the second transistor, wherein the fourth transistor is electrically connected in series between the first voltage rail and the fifth transistor, wherein the sixth transistor is electrically connected between the second voltage rail and the second sense node, the second sense node being at a junction between the fourth transistor and the fifth transistor, wherein the first transistor and the fourth transistor are the cross-coupled transistors with a gate of the first transistor electrically connected to the second sense node and a gate of the fourth transistor electrically connected to the first sense node, wherein the third transistor and the sixth transistor are the pre-charge transistors, wherein the second transistor and the fifth transistor are the sense enable transistors, wherein the input nodes include a first input node and a second input node, wherein the first section further includes the first input node between the second transistor and ground and connectable to a first input line, and wherein the second section further includes the second input node between the fifth transistor and ground and connectable to a second input line.

* * * * *